United States Patent [19]
Bockelman et al.

[11] Patent Number: 5,376,902
[45] Date of Patent: Dec. 27, 1994

[54] INTERCONNECTION STRUCTURE FOR CROSSTALK REDUCTION TO IMPROVE OFF-CHIP SELECTIVITY

[75] Inventors: David E. Bockelman, Plantation; Robert E. Stengel, Ft. Lauderdale, both of Fla.

[73] Assignee: Motorola, Inc., Schaumburg, Ill.

[21] Appl. No.: 115,291

[22] Filed: Aug. 31, 1993

[51] Int. Cl.$^5$ .............................. H01P 3/08
[52] U.S. Cl. .......................... 333/5; 333/246
[58] Field of Search ............... 333/1, 4, 5, 246, 247

[56] References Cited

U.S. PATENT DOCUMENTS

| | | | |
|---|---|---|---|
| 4,350,958 | 9/1982 | Pagnamenta | 330/286 |
| 4,386,324 | 5/1983 | Schellenberg | 333/246 |
| 4,626,889 | 12/1986 | Yamamoto et al. | 357/71 |
| 4,831,497 | 5/1989 | Webster et al. | 361/406 |
| 5,027,088 | 6/1991 | Shimizu et al. | 333/1 |
| 5,039,824 | 8/1991 | Takashima et al. | 174/33 |
| 5,223,741 | 6/1993 | Bechtel et al. | 257/678 |
| 5,223,804 | 6/1993 | Usui | 333/1 |

FOREIGN PATENT DOCUMENTS

| | | | |
|---|---|---|---|
| 0031042 | 2/1984 | Japan | 333/247 |
| 0166803 | 6/1990 | Japan | 333/246 |
| 4180401 | 6/1992 | Japan | 333/246 |

Primary Examiner—Robert J. Pascal
Assistant Examiner—Darius Gambino
Attorney, Agent, or Firm—Juliana Agon; Andrew S. Fuller

[57] ABSTRACT

To reduce crosstalk in reentrant off-chip RF selectivity, differential circuits (402, 415), transmission lines (423, 424), and off-chip filters (422) are used in a structure that balances the parasitic capacitances associated with all of the differential elements. The structure includes a substrate (409) with a differential generating circuit (402) and a receiving circuit (415). Two differential transmission lines (423, 424), each with constant characteristic impedance, and each with balanced capacitance to ground, both being closely spaced for some distance, couple the circuits (402, 415) to closely spaced terminating pads (403). A ground plane (412) is shared under both transmission lines (423, 424). A second substrate (408) having a reentrant RF path (406) with the first substrate (409) contains an RF function such as a filter or a delay line.

13 Claims, 6 Drawing Sheets

INTERCONNECTION STRUCTURE FOR CROSSTALK REDUCTION TO IMPROVE OFF-CHIP SELECTIVITY

CROSS REFERENCE TO RELATED APPLICATIONS

This application is related to the following U.S. applications: Ser. No. 08/115,175 by David E. Bockelman and Douglas H. Weisman, entitled "*A Horizontally Twisted-Pair Planar Conductor Line Structure,*" Ser. No. (08/115,368) by David E. Bockelman, entitled "*A Vertically Twisted-Pair Conductor Line Structure,*" Ser. No. (08/115,176) by David E. Bockelman, entitled "*A Twisted-Pair Planar Conductor Line Off-Set Structure,*" and Ser. No. (08/299,857) by David E. Bockelman and Douglas H. Weisman, entitled "*A Twisted-Pair Wire Bond and Method Thereof,*" all filed concurrently herewith and all assigned to Motorola, Inc.

BACKGROUND

This invention relates to miniaturized high frequency circuits and more particularly to the interconnection of these circuits.

Referring to FIG. 1, in a multi-substrate radio frequency (RF) structure, an RF signal is routed off of one substrate 100 onto another substrate 200 and then back onto the first substrate 100. For example, in a radio transceiver, the active RF functions, such as amplifying in a generating circuit 102 and mixing in a receiving circuit 103, are fabricated on one semiconductor substrate 100 and a passive band-pass filter 101 having a certain delay is fabricated on the other substrate 200. In this case, the main RF signal passes off of the first substrate 100, is filtered or otherwise simply processed on the second substrate 200, and returns to the first substrate 100 for further processing.

This routing of the RF signal of FIG. 1 and its subsequent selectivity performance, as seen in FIG. 12, will henceforth be defined as "reentrant off-chip RF selectivity". RF selectivity is the characteristic which determines the extent to which the desired signal can be differentiated from the disturbances of other frequencies or out-of-band signals. In other words, selectivity is related to the amount of attenuation of out-of-band signals.

Generally, the active RF portion of a radio front-end of the transceiver is fabricated on a semiconductor substrate that is physically small relative to the off-chip or second substrate. This small side of the active or first substrate requires any electrical connections to be closely spaced on the semiconductor substrate. Henceforth, "closely spaced electrical connections" are defined as electrical connections which have connection areas that are spaced distally on the same order as their side length.

In prior art reentrant off-chip schemes, poor RF selectivity performance has resulted due to the cross-talk coupling or jumping of the RF signal from the input to the output of the filter at the closely spaced electrical connections, in essence by-passing the filter. Crosstalk coupling is the signal loss of the desired signal caused by the interference of stray electromagnetic coupling of energy from one circuit to another, i.e., inductive and capacitive coupling existing between closely adjacent parallel electrical connections such as bonding pads. Viewed from a different perspective, when routing a signal off-chip through a short electrical delay of the filter, the mingling of the signals between the input and output of the signal processor, each contributing to the cross-talk coupling, can cause severe degradation in selectivity or can otherwise degrade the desired delay or timing performance of the off-chip functional block.

The problem of crosstalk with reentrant RF connections, increases as the RF electrical connections are spaced closer. The strongest mode or one cause of cross-talk coupling with reentrant RF connections is known as common mode impedance coupling and often experienced in a single ended circuit.

Single ended circuits generate or receive a single alternating current (AC) signal which is referenced to a common ground. Many, or all, circuits in such a single-ended system share a common ground, and all the signal currents return to their originating circuits through this common ground. However, any shared ground has a non-zero impedance which is common to all circuits, and this common impedance provides a path through which signals can couple add ohmic loss occurs.

In the case of reentrant off-chip RF selectivity of FIGS. 1 and 12, the RF signal generated by the generating circuit 102 will be coupled into the load or the receiving circuit 103 as a function of the ohmic loss or common impedance 104, as represented schematically in FIG. 1 and the, resultant response shown in FIG. 12. Trace 1201 of FIG. 12 represents a typical frequency response of the filter 101 alone having about 80 dB of out-of-band attenuation, and trace 1200 represents a typical degraded response with the common impedance 104 added to the filter 101. Therefore, the maximum out-of-band attenuation or selectivity of the band-pass filter 101 will not be realized with the single-ended circuit of FIG. 1. Instead, the cross coupling generally results in out-of-band attenuation, or selectivity, of only approximately 30 dB as seen in trace 1200 of FIG. 12.

Conventionally, the efforts to increase the selectivity have focused on improving grounding and providing multiple ground straps to reduce the cross coupling. However, these efforts alone have failed to produce any significant improvement in selectivity because single-ended circuits were still used in these reentrant off-chip schemes. Accordingly, it is desired to provide an improved reentrant off-chip RF selectivity structure that reduces crosstalk significantly at the filter connections for RF processing but is not limited to frequency selective filtering.

DETAILED DESCRIPTION OF THE PREFERRED EMBODIMENT

Figure 2:
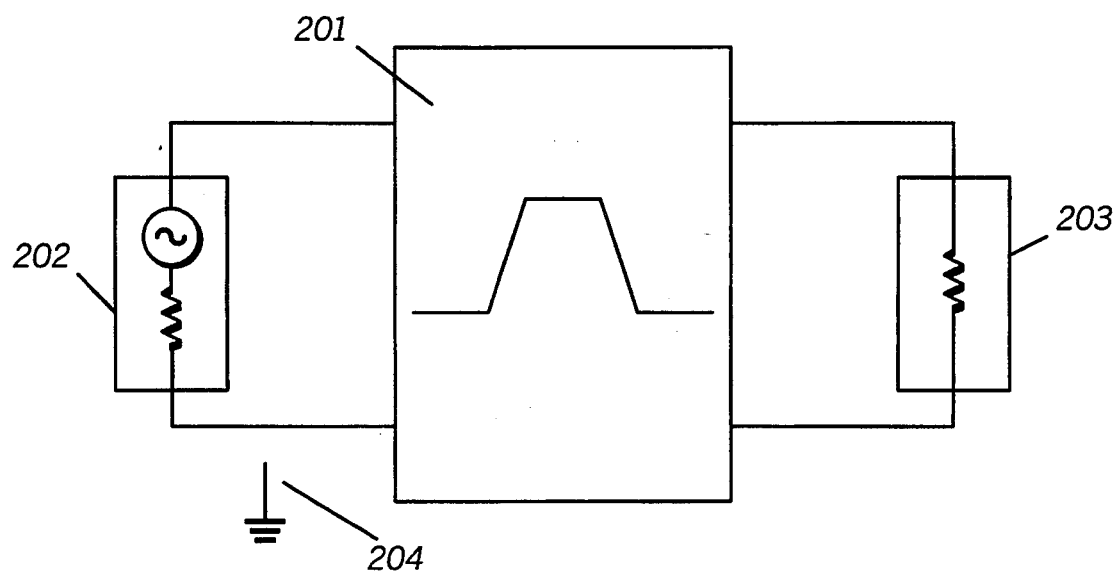
FIG. 2 is a block diagram of an ideal representation of a differential filtering system.

Like reference numerals are carried forward in the following description of embodiments where the effect of the common impedance can be greatly reduced by using differential circuitry in miniaturized high frequency applications, such as integrated circuits or chips. Referring to FIG. 2, an ideal representation of a differential filtering system is shown, in which a generator 202, a load 203, and a filter 201 are all isolated from a common reference point 204.

Figure 3:
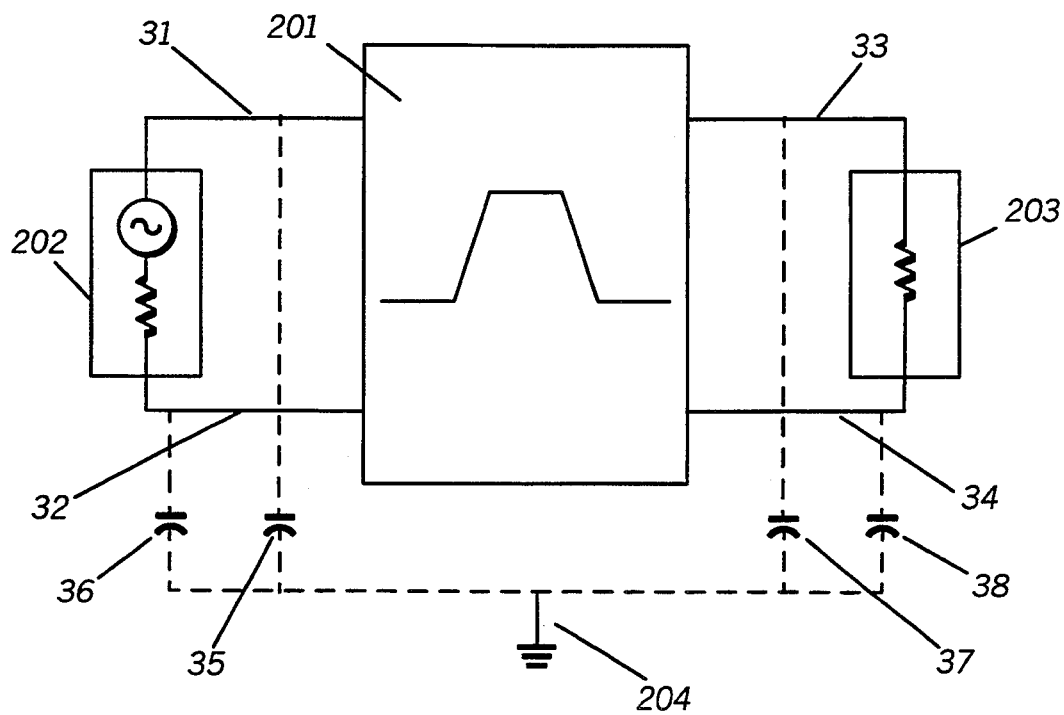
FIG. 3 is a block diagram of a non-ideal representation of a differential filtering system.

However, in a practical implementation of a differential system such as in FIG. 3, all conductors 31–34 in the RF path will have at least some parasitic capacitance 35–38 to a common point 204, such as the semiconducting substrate itself which serves as a weakly conductive ground plane. In semiconductor embodiments, the semiconductor substrate represents a conductive surface to the circuitry above it. However, the substrate conductivity is poor compared to a metal, and this poor conductivity causes the substrate to be a poor RF ground plane.

Figure 1:
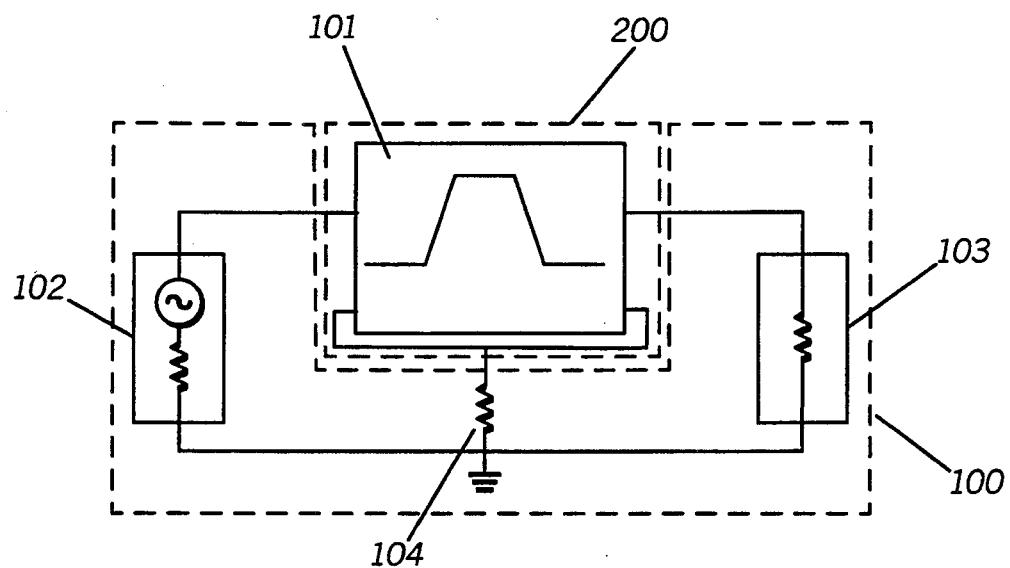
FIG. 1 is a block diagram of a circuit with a common mode impedance.

For example, a lightly doped semiconductor substrate (typical for Silicon Si processes) will exhibit significant ohmic losses between two points on the substrate, as well as voltage dependent depletion capacitances between the reference potential and all other circuitry above the substrate. The low conductivity allows one point on the substrate to have one value of depletion capacitance while a second physically separate point on the substrate has a different value of depletion capacitance. If these two points represent two differential signal paths, then the two paths will share a common impedance 104, as seen in FIG. 1, and hence, signals will couple between the two paths. Additionally, the ohmic losses of the semiconductor substrate could represent a portion of the common impedance 104, and also contribute to the crosstalk coupling.

This parasitic capacitance can cause significant common-impedance coupling with reentrant off-chip RF selectivity, even if differential circuits are used. Thus, if capacitors 35 and 36 are not equal, or if capacitors 37 and 38 are not equal, then the response of the filter system will be similar to the unoptimized trace 1200 of FIG. 12.

To significantly reduce crosstalk in reentrant off-chip RF selectivity in accordance with the teachings of this invention, differential circuits, differential transmission lines, and differential off-chip functions such as filtering are used simultaneously. Furthermore, this invention provides a structure that will balance the parasitic capacitances associated with all of the differential elements.

Figure 4:
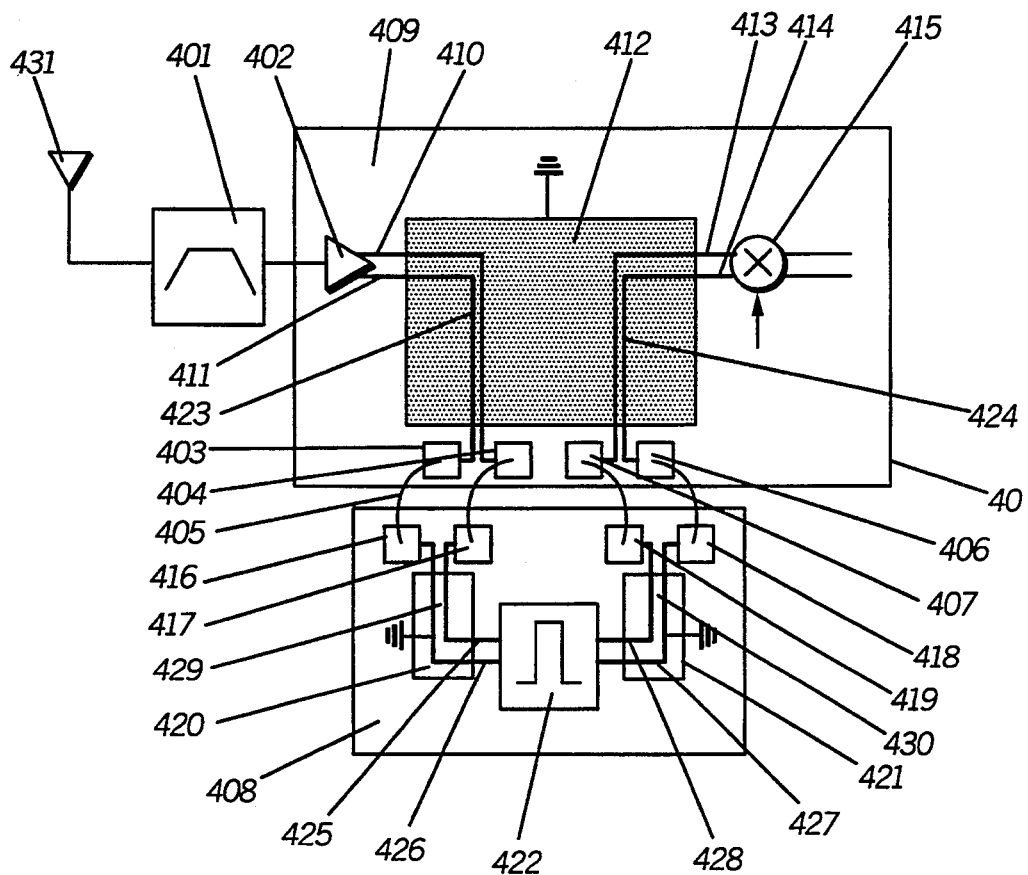
FIG. 4 is a block diagram of a radio receiver front-end, in accordance with the invention.

Referring to FIG. 4, a radio receiver front-end is schematically represented. In this embodiment, a semiconductor substrate (e.g. Si or Gallium Asenide GaAs) 409 having top and bottom surfaces surrounded by an edge 40 on one end includes at least an RF amplifier 402 and a mixer 415 formed in the substrate. The amplifier 402 has a differential output that generates a pair of complementary signals in a phase-inverted relation with each other, known together as a single differential signal which by definition implies that the individual output terminals do not share a common ground. The amplifier 420 has a predetermined source impedance, preferably at 50 Ohms. The mixer 415 receives a differential RF signal, and has a certain load impedance, preferably also 50 Ohms.

Also included on the substrate 409 is a set of two pairs of conductors, 410,411 and 413, 414, respectively, forming two physically dose transmission lines 423 and 424 having predetermined physical dimensions necessary to form the desired characteristic impedance in order to properly match the impedances of the source to the load. The distance between the two physically close conductors is approximately less than ten times the space between the two conductors of a single transmission line. The transmission lines 423 and 424 are adjacent and substantially parallel for some length. There could be one or more ninety degree bends in the line even though no turns are required. However, if turns are used, as seen in FIG. 4, some compensation may be needed to provide the proper impedance matching in the transmission lines.

A highly conductive or otherwise metal ground plane, or any equipotential conducting plane 412, is provided as commonly underneath both transmission lines 423 and 424. Insulated on both top and bottom surfaces, the ground plane 412 is disposed underneath the transmission, lines 423 and 424, over the top surface of the substrate, and away from the edge 40. For a Si processed substrate, the metal plane is connected to a certain voltage point such as a circuit ground. For other substrates, the ground plane can simply be flee-standing as a metal layer.

A means of providing electrical connections to the semiconductor substrate 409, in the form of electrical terminals, is shown in this embodiment as wire-bonding pads 403, 404, 406, and 407. The two pairs of bonding pads 403, 404 and 406, 407 which correspond to the electrical connections or terminations for the transmission lines 423 and 424, respectively, are adjacent and disposed on the same layer as the lines. These bonding pads are areas of unpassivated metal which are large enough to allow conductive runs, such as standard wire bonds 405 to be attached on the surface of the pads 403, 404, 406, and 407. A common pad size is on the order of 100 micrometers squared with a side length of 100 um. Generally, such bonding pads have a minimum center-to-center spacing commonly of about 150 um.

The ground plane 412 can extend underneath the bond pad 403, 404, 406, and 407, but it is preferred that the ground plane 412 be truncated away from the pads. This truncation reduces the capacitance from the pads to ground, which can otherwise be too large to provide a useful RF connection.

This ground plane 412 is a key component of this invention, particularly in semiconductor embodiments. By adding a high conductivity ground plane 4 12, such as a large metal bottom layer, the common impedance coupling can be controlled by the predetermination of the physical dimensions of the circuits above the plane.

For instance, the two conductors 410 and 411 of the differential transmission line 423 can be assured of having substantially equal capacitance to the ground plane 412 by adjusting their widths and their heights above the ground plane 412. No longer is the capacitance, such as 35 or 36 of FIG. 3, a function of the voltages on the transmission line conductors. Furthermore, by imposing the requirement that the physically close differential transmission lines 423 and 424 share a single large highly conductive ground plane 412, any common impedance between the transmission lines 423, 424 is reduced further yet. A good ground plane has lower losses than a substrate. Therefore, parasitic capacitances can be well-balanced to reduce cross-talk coupling. Without this highly conductive ground plane 412 and the differential transmission lines, crosstalk between the two signal paths would be unacceptable, particularly for off-chip selectivity in a radio receiver.

A further component of the embodiment of FIG. 4 is a second substrate 408 on which is constructed a filter 422. The corresponding wire-bonding pads 416–419 permit the wire bonds 405 to connect the two substrates 408 and 409.

Figure 12:
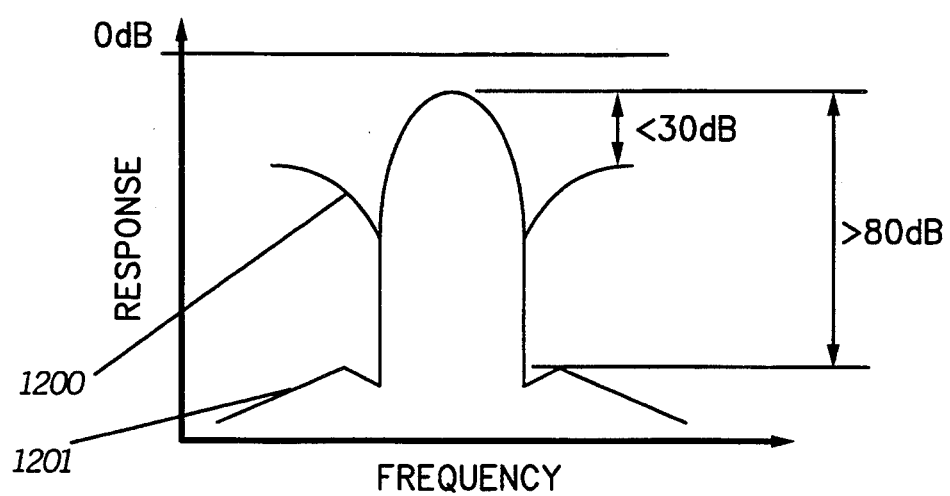
FIG. 12 is a frequency response graph showing the out-of-band attenuation of the ideal filter 201 in the circuit of FIG. 2 vs. its performance in the circuit of FIG. 3.

The specifications of a common radio system would require about 80 dB of selectivity from such a filter, as seen in trace 1201 of FIG. 12. The actual filter 422 can be implemented in many fashions and with many different materials, but all such implementations must have a set of critical constraints. First, the filter 422 must have differential inputs and outputs, each with a certain source or load impedance, preferably 50 ohms. Further, the differential input defined by the two ungrounded input terminals 425 and 426 and the differential output defined by the two ungrounded output terminals 427 and 428 of the filter 422 must not share any common ground; i.e. all the terminals 425, 426, 427, and 428 must be substantially isolated from any common ground.

If transmission lines 429 and 430 are necessary for the filter, instead of having an already properly matched integrated filter package, such as a differential surface acoustical wave (SAW) filter, the transmission lines 429 and 430 must follow the same constraints applied to transmission lines 423 and 424. The ground planes 420 and 421 are shown, but need not be, electrically connected to the ground plane 412.

In order to maintain the 80 dB selectivity of the filter 422 under the adversed conditions of closely spaced electrical connections, a structure which adheres to the principles, in accordance with the present invention, should be implemented. Without the particular re-entrant treatment of the off-filter-on transitions, the crosstalk between the input 425 and 426 and output 427 and 428 of the filter 422 would limit the selectivity to the order of 30dB, as seen in trace 1200 of FIG. 12.

Referring back to FIG. 3, an antenna 431 and a wideband preselector or preamplifier filter 401 receives and further prepares the incoming RF signal to be applied to the RF amplifier 402. The interconnection between the preselector 401 and the preamplifier 402 can be made through a variety of commonly accepted methods, including a differential transmission line, such as transmission lines 424 and 423.

The transmission lines 423 and 424 (and transmission lines 429 and 430, if needed) can have many different embodiments within a set of predetermined constraints. The transmission lines must be differential, each differential transmission line must have two non-ground conductors. The transmission lines 423 and 424 must have substantially identical cross sections, and these cross sections must be substantially constant over the length of the transmission lines. even there Furthermore, the conductors 410, 411, 413, and 414 must be geometrically configured to have substantially equal capacitance to the ground plane 412.

Figure 5:
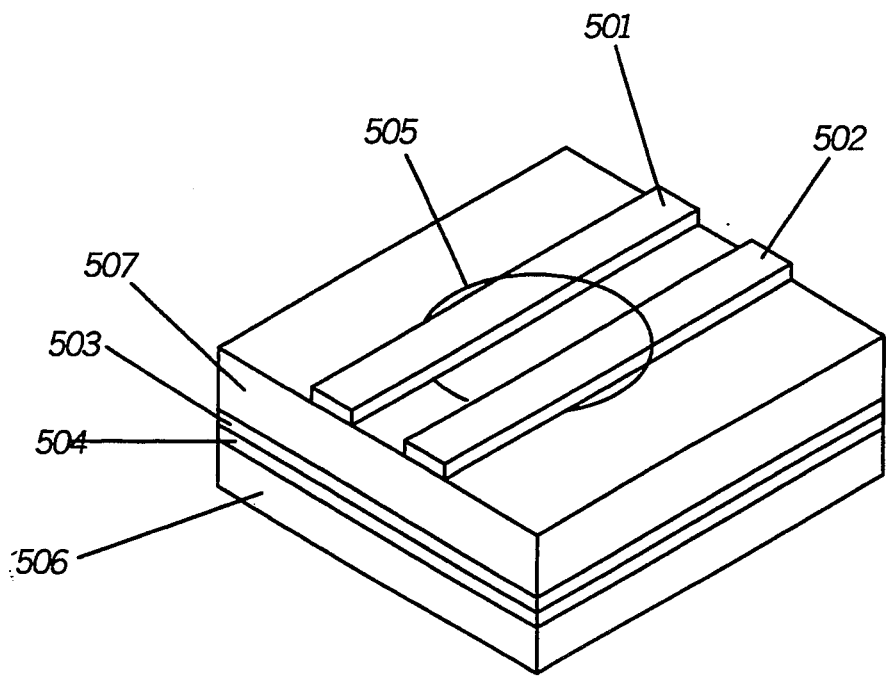
FIG. 5 is a diagram of the differential transmission line 423 of FIG. 4, in a parallel configuration.

Referring to FIG. 5, one embodiment of the transmission lines 423 and 424 is shown arranged in a parallel configuration. The conductors 501 and 502 combine to make a differential transmission line 505. Both conductors 501 and 502 reside in a horizontally oriented plane, and hence this transmission line structure will be referred to generally as a horizontally oriented planar differential transmission line, or simply a horizontal differential transmission line. The conductors 501 and 502 have substantially equal widths and substantially equal heights above the common potential ground plane 503. The width and height of the conductors, and the horizontal separation between them, define the characteristic impedance of the transmission line 505.

A ground plane 503 is shown at some defined distance below the conductors 501 and 502, with a first insulating layer 507 interposed. The ground plane 503 can lie directly underneath, on one surface of the semiconducting substrate 506, or can be insulated by a second insulating layer 504. It is important to note that conductors 501 and 502 are geometrically configured to have equal capacitance to the ground plane 503.

Figure 6:
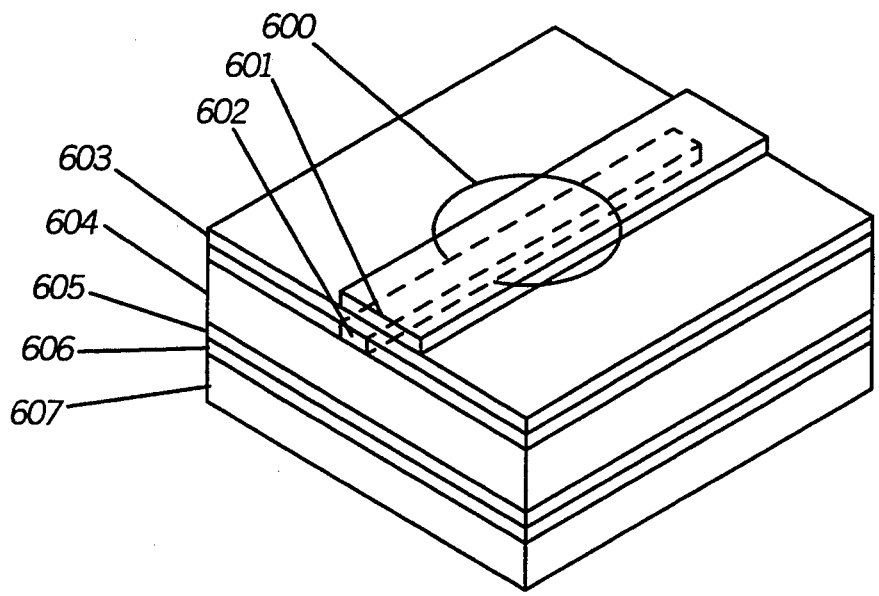
FIG. 6 is a diagram of the differential transmission line 423 of FIG. 4, in a vertically stacked configuration.

Referring to FIG. 6, another embodiment of the transmission lines 423 and 424 is shown in a stacked configuration. The conductors 601 and 602 combine to make a differential transmission line 600. The conductors 601 and 602 are stacked vertically, conductor 601 atop conductor 602, and hence this transmission line structure will be referred to generally as a vertically oriented planar differential transmission line, or simply a vertical differential transmission line.

The top conductor 601 has a wider width than the bottom conductor 602, with the width of the top 601 being approximately twice the width of the bottom 602. The exact relationship between the widths is such that the capacitance from the top conductor 601 to the ground plane 605 is substantially equal to the capacitance from the bottom conductor 602 to the ground plane 605.

The conductors 601 and 602 are separated by a first insulating layer 603. The width and height of the conductors 601 and 602, and the vertical separation between them, define the characteristic impedance of the transmission line 600. As described previously, the ground plane 605 is shown at some defined distance below the bottom conductor 602, with a second insulating layer 604 interposed. The ground plane 605 can lie directly on the semiconducting substrate 607, or can be insulated by a third insulating layer 606.

However, by widening the top conductor 601 to balance parasitic capacitance to ground, other imbalances are introduced. The wider top conductor 601 has lower ohmic losses and a lower self-inductance than the narrower bottom conductor 602. This imbalance in the conductor losses and inductances can increase the amount of common mode impedance coupling. To counter these imbalances, a structure, such as shown in FIG. 7, is used.

Figure 7:
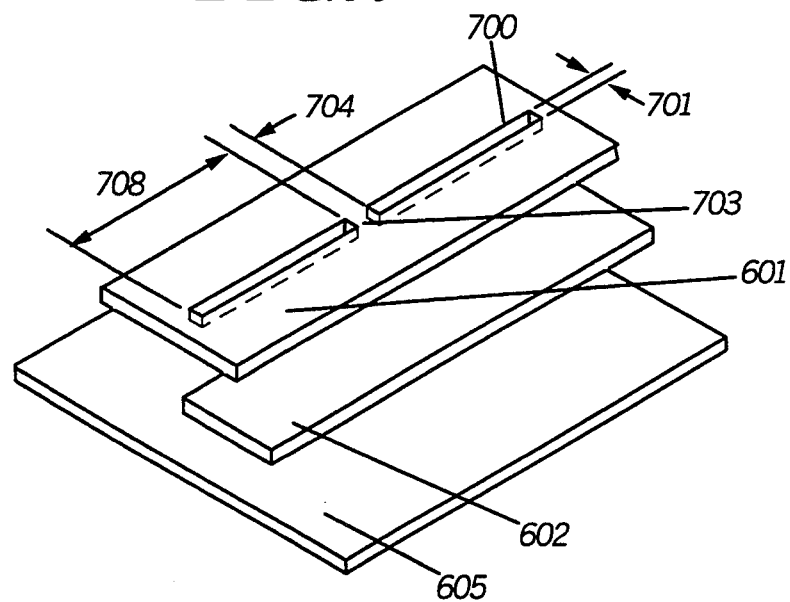
FIG. 7 is a diagram of an improved structure for the differential transmission line 423 of FIG. 6, in a vertically stacked configuration.

Referring to FIG. 7, a fully balanced vertical differential transmission line is shown, over the ground plane 605. For simplicity and clarity, intervening layers of supporting materials are not shown. An aperture, such as a slot 700 is made through the top conductor 601. This slot 700 is substantially centered at the width of the top conductor 601, and it is aligned lengthwise on the top conductor. The width 701 of the slot is such that the top conductor 601 has losses and self-inductance approximately equal to that of the bottom conductor 602. The width 701 is chosen to be slightly less than the width of the bottom conductor 602, as a compromise between balance and transmission quality. The length 702 of the slot can be any convenient length, and ideally there would be one long slot down the entire length of the transmission line. However, in order to ensure good transmission quality, the slot length is preferred to be on the order of 10 to 20 times the width of the bottom conductor 602. Furthermore, by keeping the length of the slot several orders of magnitude shorter than a wavelength, a slot will not behave as an antenna at the operating frequency, and radiation losses will be negligible. When the transmission line is longer than the slot length 702, an arbitrary number of slots 700 are placed periodically down the length of the top conductor 601. The slots 700 are separated by an intermediary section 703 of the top conductor 601, and this separation is of a smaller length 704.

Figure 8:
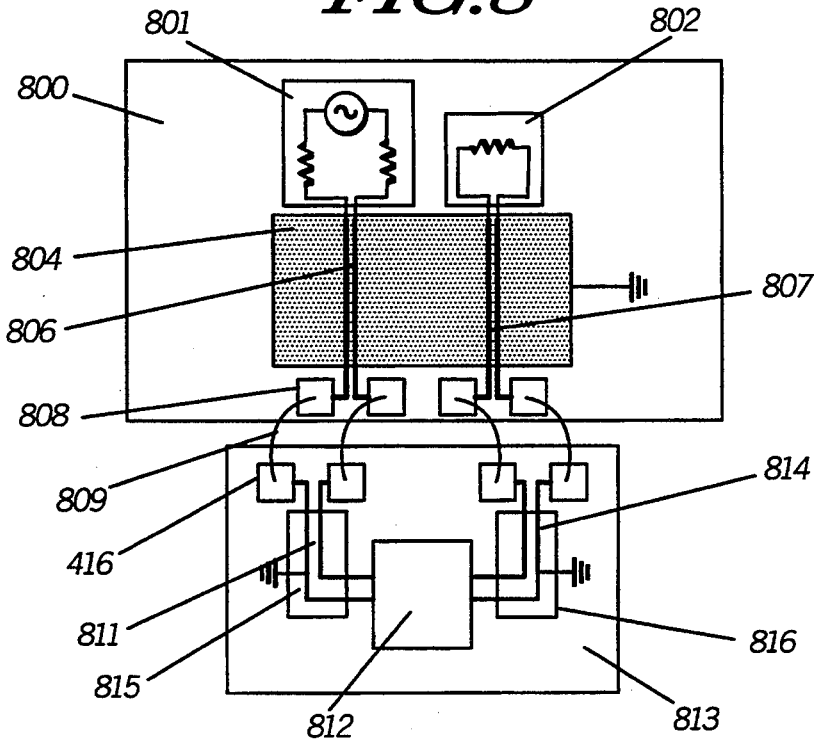
FIG. 8 is a block diagram of a generalized reentrant off-chip circuit, in accordance with the invention.

Referring to FIG. 8, a more generalized circuit, in accordance with the invention is represented. A semiconductor substrate 800 contains at least a generating circuit or generator 801 and a receiving circuit 802. The generator 801 has an output that generates a pair of complementary signals in a phase-inverted relation with each other, known together as a single differential signal. Correspondingly, the receiving circuit 802 has an input that can receive such differential signals. Also included are a pair of differential transmission lines 806 and 807, which are subject to the same constraints as noted previously; a ground plane 804; and connecting areas 808, all described previously for FIG. 4.

The generalized embodiment of FIG. 8 also contains a second substrate 813, and electrical connections 809 between the substrates 800 and 813, here shown as wire bonds. The second substrate 813 contains at least a functional block 812, such as a frequency selective filter. However, other functions, such as a delay line, can be substituted. The requirements of the functional block 812 are the same as previously described: first, the functional block must have differential inputs and differential outputs, each with a certain source or load impedance, preferably at 50 ohms. Further, the input and output of the functional block 812 must not share any common ground; all terminals must be substantially isolated from any common ground. If transmission lines 811 and 814 are provided, the transmission lines 811 and 814 must follow the same constraints applied to the transmission lines 806 and 807 of the first substrate 800. The ground planes 815 and 816 can be, but need not be (not shown), electrically connected to the ground plane 804.

Figure 9:
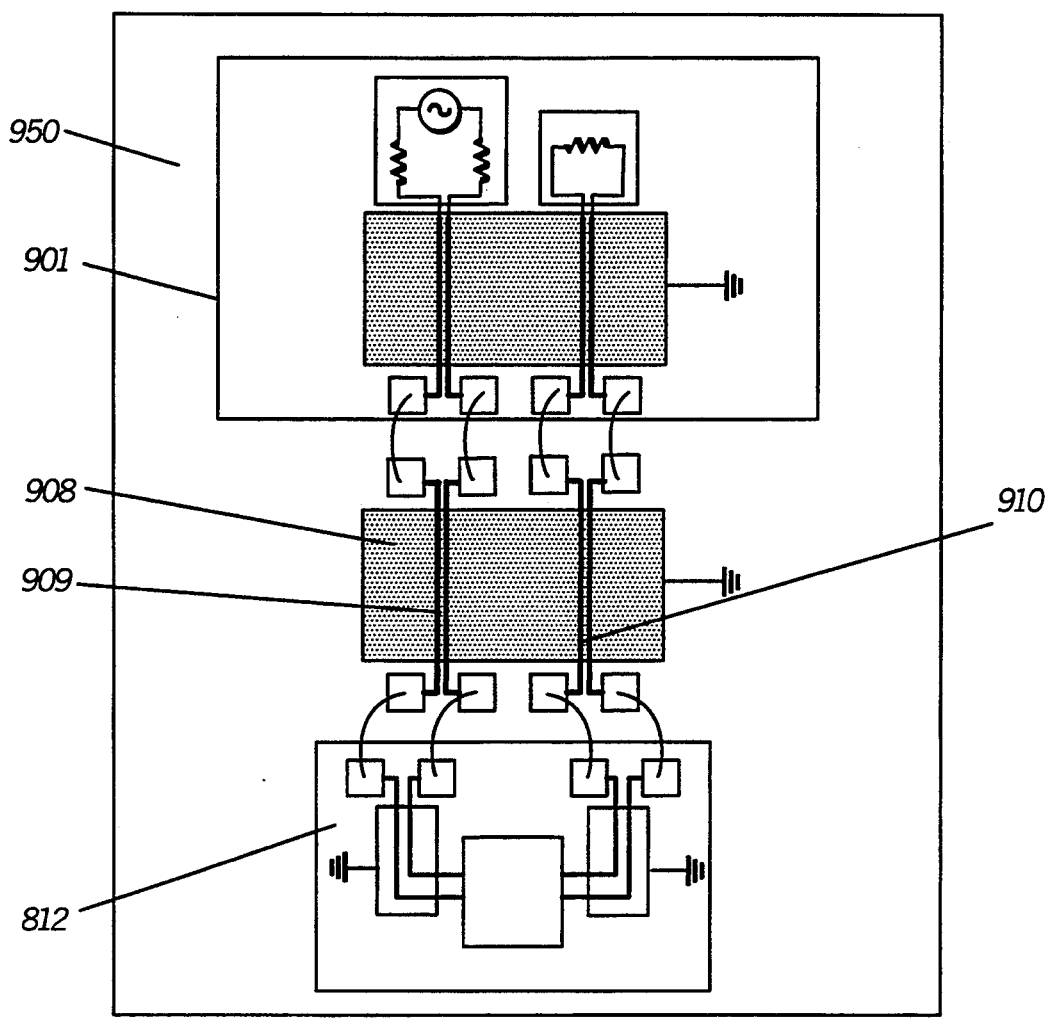
FIG. 9 a block diagram of a generalized reentrant substrate interconnection, in accordance with the invention.

Referring to FIG. 9, another embodiment of the substrate interconnection is shown. This embodiment is similar to that in FIG. 8 with the addition of intermediary transmission lines 909 and 910 and ground plane 908. In this embodiment, the transmission lines 909 and 910 on a common supporting substrate 950 (such as a printed circuit board, a ceramic substrate, or a flex board) allows the off-chip or second substrate 812 to be moved away from the semiconductor substrate 901 without compromising the reduction of crosstalk. The ground plane 908 is again separated by an insulating layer and the ground plane 908 may be on the back side of the common substrate 950. Transmission lines 909 and 910, as with all the other components, are subject to the same restraints as described previously.

Figure 10:
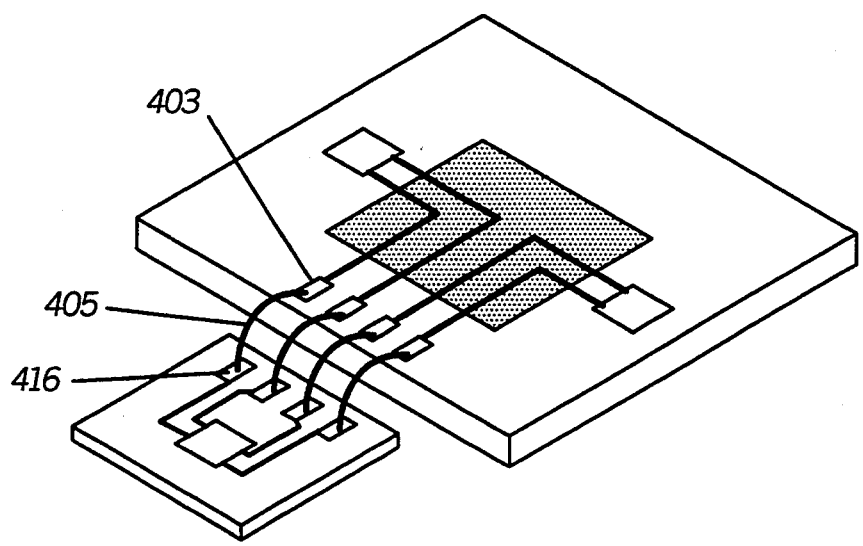
FIG. 10 is a diagram of a wire-bond substrate interconnection of the generalized reentrant off-chip circuit of FIG. 8.
Figure 11:
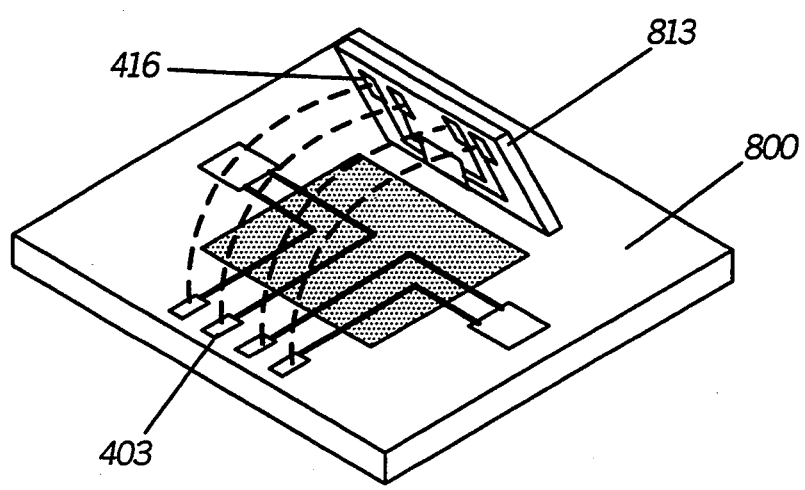
FIG. 11 is a diagram of a flip-chip interconnection of the generalized reentrant off-chip circuit of FIG. 8.

The electrical connections between substrates can have several embodiments, aside from the separate intermediary structure of FIG. 9. One type of intersubstrate interconnection, as mentioned through-out, is using wire bonds 405 as shown in FIG. 10. Another intersubstrate interconnection is known as "flip chip" or "direct chip attach" as shown in FIG. 11, without using the wire bonds 405.

In summary, this invention helps solve the problem of signal crosstalk when routing a signal off a substrate, onto a second substrate, through an electrical signal processor (such as a filter with a relatively short delay), and back on to the first substrate, particularly when the electrical connections must be made in close confinement. Under the adversed conditions of closely spaced electrical connections, the implementation of all components of the transmission system must be carefully controlled by the appropriate differential transmission line structure in order to reduce crosstalk between the signal processor input and the output.

What is claimed is:

1. An interconnection structure for miniaturized high frequency circuits comprising:

a substrate having an edge, the substrate comprising:

a generating circuit formed into the substrate for generating a first pair of complementary signals in a phase-inverted relation with each other to provide a first differential signal, the generating circuit having a predetermined source impedance; and a receiving circuit, formed into the substrate, having a predetermined load impedance, for receiving a second differential signal with the predetermined load impedance;

at least one pair of terminals disposed near the edge of the substrate wherein the at least one pair of terminals comprises a quadruplet of bonding pads being arranged in close proximity to each other;

at least one differential transmission line formed in the substrate coupled to the at least one pair of terminals wherein the at least one differential transmission line comprises:

an insulating layer interposed between the terminals and the common potential level layer;

at least a first pair of electric conductor pattern layers formed in a spaced relation with each other in the insulating layer, the pair of conductor pattern layers being in electrical with the generating circuit for conducting the first pair of complementary signals to two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and at least a second pair of electric conductor pattern layers formed in a spaced relation with each other in the insulating layer, the pair of conductor pattern layers being in electrical connection with the receiving circuit for receiving the second differential signal from other two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and a common potential level layer disposed below the differential transmission line and away from the terminals to balance the parasitic capacitances associated with the transmission line;

wherein each of the pair of conductor pattern layers are arranged so as to be overlapped with each other in a direction substantially perpendicular to the substrate; and wherein each of the pairs of conductor pattern layers comprises:
  a first conductor of the pair being substantially parallel to the substrate;
  a second conductor of the pair being above the first conductor, the second conductor being wider than the first conductor such that the capacitance of the second conductor to the common potential level layer is substantially equal to the capacitance of the first conductor to the common potential level layer.

2. An interconnection structure for miniaturized high frequency circuits comprising:

a substrate having an edge, the substrate comprising:
  a generating circuit formed into the substrate for generating a first pair of complementary signals in a phase-inverted relation with each other to provide a first differential signal, the generating circuit having a predetermined source impedance; and
  a receiving circuit, formed into the substrate, having a predetermined load impedance, for receiving a second differential signal with the predetermined load impedance;

at least one pair of terminals disposed near the edge of the substrate wherein the at least one pair of terminals comprises a quadruplet of bonding pads being arranged in close proximity to each other;

at least one differential transmission line formed in the substrate coupled to the at least one pair of terminals wherein the at least one differential transmission line comprises:
  an insulating layer interposed between the terminals and the common potential level layer;
  at least a first pair of electric conductor pattern layers formed in a spaced relation with each other in the insulating layer, the pair of conductor pattern layers being in electrical connection with the generating circuit for conducting the first pair of complementary signals to two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and at least a second pair of electric conductor pattern layers formed in a spaced relation with each other in the insulating layer, the pair of conductor pattern layers being in electrical connection with the receiving circuit for receiving the second differential signal from other two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and a common potential level layer disposed below the differential transmission line and away from the terminals to balance the parasitic capacitances associated with the transmission line;

wherein each of the pair of conductor pattern layers are arranged so as to be overlapped with each other in a direction substantially perpendicular to the substrate; and wherein each of the pairs of conductor pattern layers comprises:
  a first conductor of the pair being substantially parallel to the substrate;
  a second conductor of the pair being above the first conductor, the second conductor being wider than the first conductor such that the capacitance of the second conductor to the common potential level layer is substantially equal to the capacitance of the first conductor to the common potential level layer, the second conductor having at least one aperture substantially in the median of the second conductor such that the ohmic losses and the self-inductances of the second conductor are substantially equal to the ohmic losses and the self-inductances of the first conductor.

3. An interconnection structure for miniaturized high frequency circuits comprising:

a substrate having an edge, the substrate comprising:
  a generating circuit formed into the substrate for generating a first pair of complementary signals in a phase-inverted relation with each other to provide a first differential signal, the generating circuit having a predetermined source impedance; and
  a receiving circuit, formed into the substrate, having a predetermined load impedance, for receiving a second differential signal with the predetermined load impedance;

at least one pair of terminals disposed near the edge of the substrate wherein the at least one pair of terminals comprises a quadruplet of bonding pads being arranged in close proximity to each other;

at least one differential transmission line formed in the substrate coupled to the at least one pair of terminals wherein the at least one differential transmission line comprises:
  an insulating layer interposed between the terminals and the common potential level layer; 'at least a first pair of electric conductor pattern layers formed in a spaced relation with each other in the insulating layer, the pair of conductor pattern layers being in electrical connection with the generating circuit for conducting the first pair of complementary signals of two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and at least a second pair of electric conductor pattern layers formed in a spaced relation with each other in the insulating layer, the pair of conductor pattern layers being in electrical connection with the receiving circuit for receiving the second differential signal from other two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and a common potential lever layer disposed below the differential transmission line and away from the terminals to balance the parasitic capacitances associated with the transmission line;

wherein each of the pairs of conductor pattern layers comprises:

a first conductor of the pair being substantially parallel to the substrate;

a second conductor of the pair being above the first conductor, the second conductor being wider than the first conductor such that the capacitance of the second conductor to the common potential level layer is substantially equal to the capacitance of the first conductor to the common potential level layer, the second conductor having at least one slot, the slot being arranged substantially in the center of the second conductor, the slot having a width such that the ohmic losses and the self-inductances of the second conductor are substantially equal to the ohmic losses and the self-inductances of the first conductor.

4. An interconnection structure for miniaturized high frequency circuits comprising:

a substrate having an edge, the substrate comprising:

a generating circuit formed into the substrate for generating a first pair of complementary signals in a phase-inverted relation with each other to provide a first differential signal, the generating circuit having a predetermined source impedance; and a receiving circuit, formed into the substrate, having a predetermined load impedance, for receiving a second differential signal with the predetermined load impedance;

at least one pair of terminals disposed near the edge of the substrate wherein the at least one pair of terminals comprises a quadruplet of bonding pads being arranged in close proximity to each other;

at least one differential transmission line formed in the substrate coupled to the at least one pair of terminals wherein the at least one differential transmission line comprises:

an insulating layer interposed between the terminals and the common potential level layer;

at least a first pair of electric conductor pattern layers formed in a spaced relation with each other in the insulating layer, the pair of conductor pattern layers being in electrical connection with the generating circuit for conducting the first pair of complementary signals to two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer; and at least a second pair of electric conductor pattern layers formed in a spaced relation with each other in the insulating layer, the pair of conductor pattern layers being in electrical connection with the receiving circuit for receiving the second differential signal from other two of the quadruplet of bonding pads disposed on top of the insulating layer, the conductor pattern layers being arranged so as to be substantially parallel with the substrate, as to provide a predetermined transmission line characteristic impedance which is substantially constant over the length of the pair of conductor pattern layers, each of the conductor pattern layers arranged to provide substantially equal capacitance to the common potential level layer;

a common potential level layer disposed below the differential transmission line and away from the terminals to balance the parasitic capacitances associated with the transmission line;

a second substrate;

a processing circuit formed into the second substrate for receiving and electrically processing the first differential signal, the electrical processing circuit having a differential input with a predetermined load impedance, the processing circuit having a differential output with a predetermined source impedance for providing the second differential signal by processing the first differential signal; and a second quadruplet of bonding pads disposed on the second substrate for providing electrical connection between the substrates.

5. An interconnection structure for miniaturized high frequency circuits comprising:

a first substrate having at least a first pair of differential transmission line ports;

a second substrate having at least a second pair of differential transmission line ports;

a first common potential level layer disposed below a portion of the first pair of differential transmission line ports to balance the parasitic capacitances associated with the first transmission line ports;

a second common potential level layer disposed below a portion of the second pair of differential transmission line ports to balance the parasitic capacitances associated with the second transmission line ports; and conductive means for connecting the differential transmission line ports of the first and second substrates, the conductive means positioned away from the first and second common potential level layers.

6. An interconnection structure for miniaturized high frequency circuits comprising:
   a first substrate having at least a first pair of differential transmission line ports;
   a second substrate having at least a second pair of differential transmission line ports;
   a first common potential level layer disposed below a portion of the first pair of differential transmission line ports to balance the parasitic capacitances associated with the first transmission line ports;
   a second common potential level layer disposed below a portion of the second pair of differential transmission line ports to balance the parasitic capacitances associated with the second transmission line ports; and
   conductive means for connecting the differential transmission line ports of the first and second substrates, the conductive means positioned away from the first and second common potential level layers;
   wherein the at least a first pair of differential transmission line ports comprises:
      a first differential input port having a first pair of input terminals, and a first differential output port having a first pair of output terminals;
      a first transmission line formed on the first substrate coupling the first output differential port to the first pair of output terminals; and
      a second transmission line formed on the first substrate coupling the first pair of input terminals to the first differential input port.

7. The interconnection structure of claim 6 wherein the at least a second pair of differential transmission line ports comprises:
   a second differential input port having a second pair of input terminals, and a second differential output port having a second pair of output terminals;
   a third transmission line formed on the second substrate coupling the second pair of input terminals to the second differential input port; and
   a fourth transmission line formed on the second substrate coupling the second differential output port to the second pair of output terminals.

8. The interconnection structure of claim 7 wherein the conductive means comprises:
   a first pair of bonding wires connecting the first pair of output terminals to the second pair of input terminals; and
   a second pair of bonding wires connecting the second pair of output terminals to the first pair of input terminals.

9. The interconnection structure of claim 7 wherein the input and output terminals of both substrates comprise bonding pads to support direct attachment of the second substrate to the first substrate when the second substrate is inverted and mounted on top of the first substrate in a flip-chip configuration.

10. An interconnection structure for miniaturized high frequency circuits comprising:
   a first substrate having at least a first pair of differential transmission line ports;
   a second substrate having at least a second pair of differential transmission line ports;
   a first common potential level layer disposed below a portion of the first pair of differential transmission line ports to balance the parasitic capacitances associated with the first transmission line ports;
   a second common potential level layer disposed below a portion of the second pair of differential transmission line ports to balance the parasitic capacitances associated with the second transmission line ports; and
   conductive means for connecting the differential transmission line ports of the first and second substrates, the conductive means positioned away from the first and second common potential level layers;
   wherein the conductive means comprises:
      a third substrate having at least a third pair of differential transmission line ports;
      a third common potential level layer disposed below a portion of the third pair of differential transmission line ports to balance the parasitic capacitances associated with the third transmission line ports; and
      bonding wires for connecting the differential transmission lines ports of the first and second substrates, the bonding wires positioned away from the first, second, and third common potential level layers.

11. An interconnection structure for a circuit, comprising:
   a substrate having a differential transmission line and a common potential level layer disposed substantially parallel to the differential transmission line;
   wherein the differential transmission line comprises first and second conductors and wherein the second conductor is substantially parallel to the first conductor, the second conductor being wider than the first conductor such that the capacitance of the second conductor to the common potential level layers is substantially equal to the capacitance of the first conductor to the common potential level layer.

12. An interconnection structure for a circuit, comprising:
   a substrate having a differential transmission line and a common potential level layer disposed substantially parallel to the differential transmission line;
   wherein the differential transmission line comprises first and second conductors and wherein the second conductor is substantially parallel to the first conductor, the second conductor being wider than the first conductor such that the capacitance of the second conductor to the common potential level layer is substantially equal to the capacitance of the first conductor to the common potential level layer, the second conductor having at least one slot, the slot being arranged substantially in the center of the second conductor, the slot having a width such that the ohmic losses and the self-inductances of the second conductor are substantially equal to the ohmic losses and the self-inductances of the first conductor.

13. An interconnection structure comprising:

a substrate having a pair of input terminals and a pair of output terminals to provide external electrical coupling to the substrate;

an input differential transmission line formed in the substrate coupled to the pair of input terminals and an output differential transmission line formed in the substrate coupled to the pair of output terminals;

a common potential level layer disposed substantially parallel to the differential transmission line to balance the parasitic capacitances between the input and output differential transmission lines;

a second substrate;

a processing circuit formed into the second substrate for receiving and electrically processing a first differential signal, the electrical processing circuit having a differential input, the processing circuit having a differential output for providing a second differential signal by processing the first differential signal; and the differential input of the second substrate being electrically coupled to the output differential transmission line of the first substrate via the pair of output terminals and the differential transmission line of the first substrate via the pair of input terminals.

* * * * *

UNITED STATES PATENT AND TRADEMARK OFFICE
CERTIFICATE OF CORRECTION

PATENT NO. : 5,376,902
DATED : December 27, 1994
INVENTOR(S) : David E. Bockelman, Robert E. Stengel It is certified that error appears in the above-indentified patent and that said Letters Patent is hereby corrected as shown below:

Column 8, line 52, after "layers" should read as folows:
--being in electrical connection with the--.

Column 16, line 11-13, after "terminals" should read as follows:
--and the differential output of the second substrate being
electrically coupled to the input differential transmission line
of the first substrate via the pair of input terminals.--

Signed and Sealed this

Ninth Day of May, 1995

Attest:

Attesting Officer

BRUCE LEHMAN

Commissioner of Patents and Trademarks